United States Patent [19]

Kou

[11] Patent Number: 5,730,210
[45] Date of Patent: Mar. 24, 1998

[54] HEAT SINK HAVING AN ASSEMBLING DEVICE

[75] Inventor: Chih Hsien Kou, Taipei, Taiwan

[73] Assignee: Silicon Integrated Systems Corporation, Hsinchu, Taiwan

[21] Appl. No.: 804,547

[22] Filed: Feb. 24, 1997

[51] Int. Cl.$^6$ ..................................................... H05K 7/20
[52] U.S. Cl. ........................... 165/80.3; 361/704; 257/719
[58] Field of Search ................................ 165/80.3, 185; 361/697, 704; 257/722, 719

[56] References Cited

U.S. PATENT DOCUMENTS

| | | | |
|---|---|---|---|
| 4,246,597 | 1/1981 | Cole et al. | 165/80.3 X |
| 4,712,159 | 12/1987 | Clemens | 165/80.3 X |
| 4,849,856 | 7/1989 | Funari et al. | 165/80.3 X |
| 5,006,796 | 4/1991 | Burton et al. | 324/158 F |
| 5,276,585 | 1/1994 | Smithers | 361/704 |
| 5,381,305 | 1/1995 | Harmon et al. | 361/704 |
| 5,436,798 | 7/1995 | Wieland, Jr. | 361/710 |
| 5,519,574 | 5/1996 | Kodama et al. | 361/697 |

*Primary Examiner*—Allen J. Flanigan
*Attorney, Agent, or Firm*—Merchant, Gould, Smith, Edell, Welter & Schmidt, P.A.

[57] ABSTRACT

A heat sink having an assembling device using mechanical characteristics of resilience or flexibility so as to effectively fasten a heat sink. In one embodiment, this invention comprises a chassis having a heat dissipating surface, a plurality of fastening holes formed on the chassis, and fastening bolts and helical springs corresponding to the fastening holes, wherein the fastening bolts each further comprise a mushroom-shaped insertion end. In another embodiment, the heat sink comprises a chassis having a heat dissipating surface and a fastening seat for fastening the heat sink, wherein the fastening seat is formed of a resiliently curvable and integrally formed sheet and is provided with a pair of hooks each having a V-shaped barb for inserting the invention into holes abutting the chip and pre-formed on a motherboard and for resiliently pressing the heat sink against the chip.

3 Claims, 4 Drawing Sheets

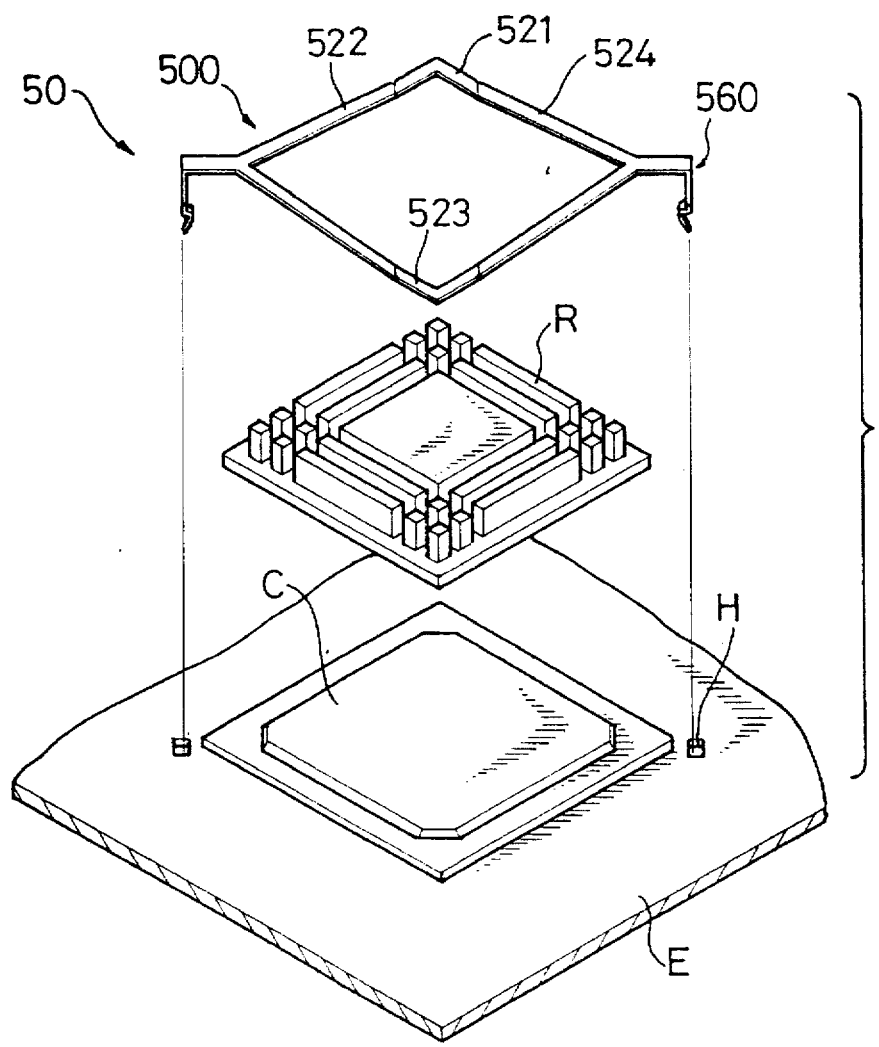
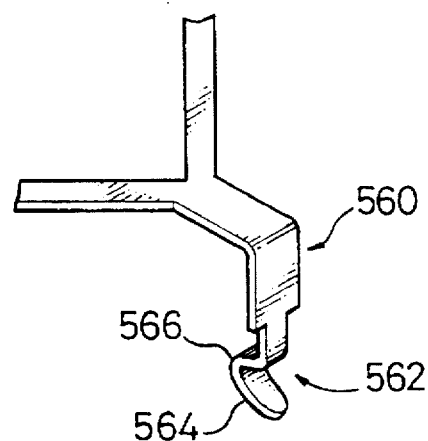
FIG. 5
FIG. 6

HEAT SINK HAVING AN ASSEMBLING DEVICE

BACKGROUND OF INVENTION

This invention relates to a heat sink for use in a computer, particularly to a heat sink having an assembling device.

The chips currently used by motherboards generate high temperatures during operation thereby affecting the life term thereof. The industry has developed heat sinks disposed over the chips by means of certain structures so as to effectively eliminate and dissipate heat generated thereby.

Accompanied with the implementation of heat sinks, the industry has developed various methods for fastening heat sinks onto the chips, such as by adhesive or by various clamping assemblies. These conventional methods are, however, not well accepted by manufacturers. For example, while using adhesive for fastening heat sinks, the heat sinks frequently peel off during transportation due to failure of adhesive. Using conventional clamping structure, the chips are easily damaged due to structural defects of clamping members resulting from maintenance or disassembling processes.

The present invention resolves such shortcomings of conventional fastening or resilient fastening structure.

BRIEF DESCRIPTION OF INVENTION

One objective of the invention is to provide a heat sink having an assembling device which steadfastly fastens a conventional heat sink onto a chip in a simple manner by means of simple mechanical concepts of resilience and flexibility.

According to an embodiment of the invention, a heat sink having an assembling device comprises a chassis having a heat dissipating surface, a plurality of fastening holes formed of the chassis, and fastening bolts as well as helical springs corresponding to the fastening holes, wherein the fastening bolts each further comprise a mushroom-shaped insertion end.

According to another embodiment of the invention, a heat sink having an assembling device comprises a chassis having a heat dissipating surface and a fastening seat for fastening the heat sink.

More particularly, the fastening seat is formed of a resiliently deformable and integrally formed hollow sheet and is provided with a pair of hooks each having a V-shaped barb for inserting the chassis into a hole, that is pre-formed on a motherboard and abuts a chip, and for resiliently pressing the heat sink against the chip.

Not only does the structure provided by the embodiments as described in the invention allow the heat sinks to be easily assembled and efficiently disassembled, but also prevent the chips from damage.

The foregoing and other technical contents of the invention can be further realized with the drawings and detailed explanations of the embodiments.

BRIEF DESCRIPTION OF DRAWING

FIG. 5 is an exploded structural schematic view of FIG. 1;

FIG. 6 is an enlarged view of the hook structure of FIG. 5; and

| LIST OF SYMBOLS | |
|---|---|
| 20 heat sink | 30 fastening bolt |
| 202 chassis | 302 heat portion |
| 204 chassis edge | 304 bolt body |
| 206 fastening end | 306 insertion end |
| 208 fastening hole | 346 open hole |
| 40 helical spring | |
| 50 fastening seat | 20' heat sink |
| 500 outer rim | 202' chassis |
| 521 first section | 204' chassis edge |
| 522 second section | |
| 523 third section | C chip |
| 524 forth section | E motherboard |
| 560 hook hole | 562 barbH'hole |
| 564 contact surface | |
| R heat dissipating surface | |
| 566 apex | |

DETAILED DESCRIPTION OF PREFERRED EMBODIMENT

Figure 1:
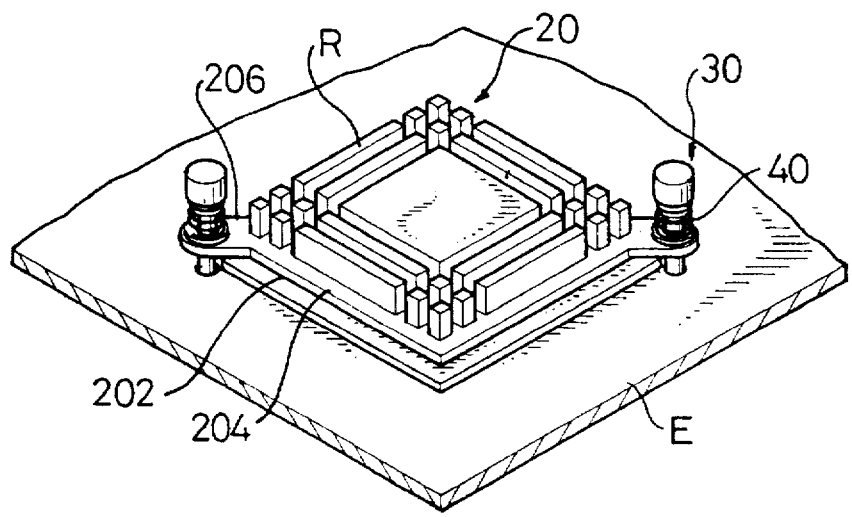
FIG. 1 illustrates a perspective view of an embodiment of the invention in use.
Figure 2:
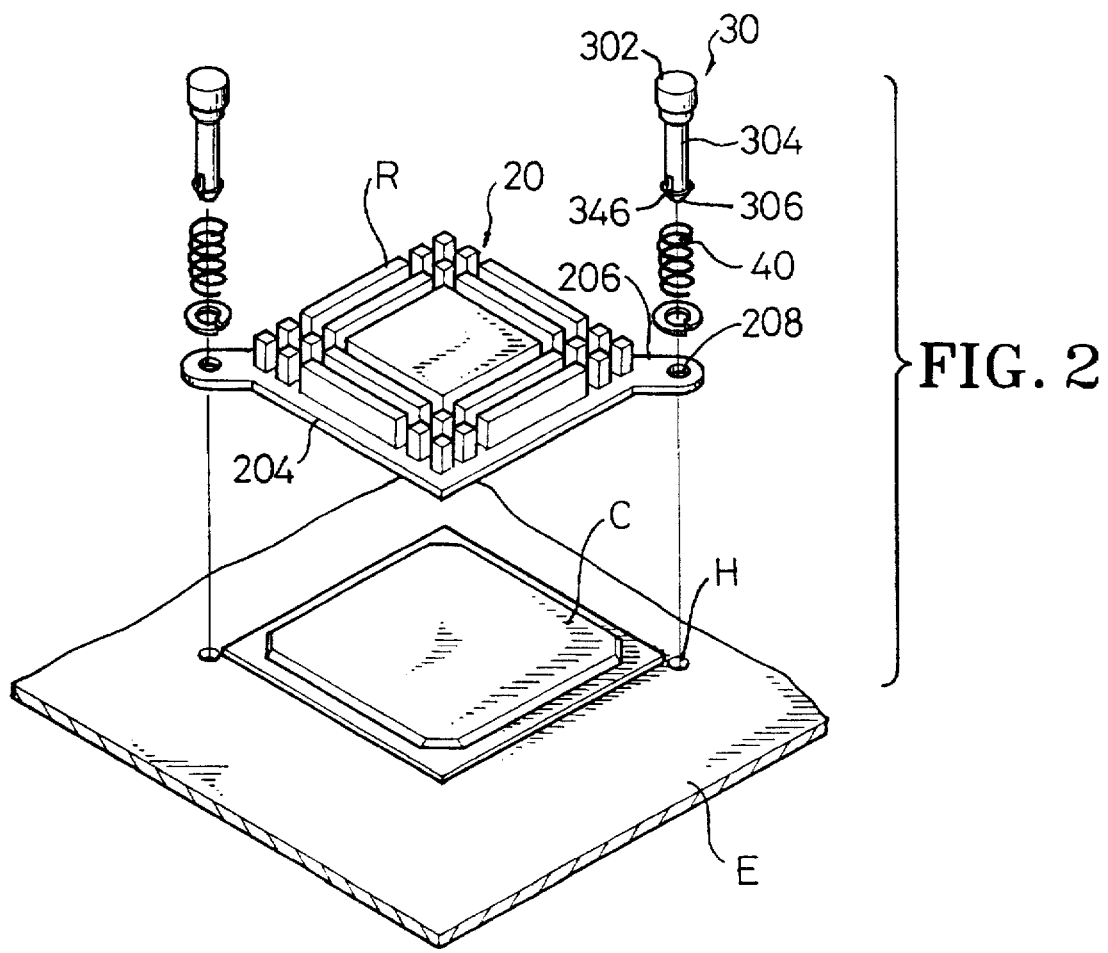
FIG. 2 is an exploded structural schematic view of FIG. 1.

FIGS. 1 and 2 illustrate an embodiment of a heat sink having an assembly device according to the invention under state of being used on a motherboard E, disclosed in which is a heat sink 20 for disposing over a chip C of the motherboard E. The heat sink 20 substantially comprises a chassis 202, fastening bolts 30, and helical springs 40.

As illustrated in FIG. 2, the chassis 202 is a flat sheet (generally rectangular) having a shape and dimension substantially identical to those of the chip C, on which chassis is formed with a plurality of heat dissipating fins so as to form a heat dissipating surface R. The planar surface between the outer most edge of the chassis 202 and the heat dissipating surface R delineates a chassis edge 204. The chassis 202 of the heat sink 20 is provided with fastening ends 206 laterally extending from the chassis edge 204. Such fastening ends do not require any specific shape or quantity and are preferred to extend from diagonal corners of the chassis edge 204 in a pair. Each fastening end is formed with a fastening hole 208 having a first diameter thereon.

Each set of fastening holes 208 further adapt to fastening bolts 30 and helical springs 40 thereby forming structure for fastening the heat sink 20. As illustrated in FIG. 2, the fastening bolt 30 is substantially in a columnar configuration, the structure of which includes a head portion 302, a bolt body 30, and an insertion end 306. The head portion 302 located on top of the fastening bolt 30 has a large cross-sectional area as compared with that of the fastening bolt 30 body. The bolt body 304 is a substantially cylindrical body having a second diameter and locating beneath the head portion 302, one end of the which bolt body is connected to the heat portion 302 and the other end extends downwardly and connects to the insertion end 306. The second diameter of the bolt body 302 is substantially smaller than or identical with the first diameter. The insertion end 306 is substantially similar to an inverted frustocone and gradually converges and extends from the bolt body thereby forming a cylindrical frustum configuration. The cross-section of the junction where the insertion end 306 and the bolt body 304 joins is a circular one having a third diameter.

The third diameter is larger than the first diameter of the fastening hole 208 and the second diameter of the bolt body 304. Furthermore, the fastening bolt 30 is preferably formed with a narrow opening 346 laterally penetrating the insertion end 306 and extending into a portion of the bolt body 304 thereby providing compressive resiliency in the radial direction.

As illustrated in FIGS. 1 and 2, the helical spring 40 is telescopically provided over the bolt body 304 of the fastening bolt 30. The helical spring 40 has a forth diameter larger than the first diameter of the fastening hole 208. The cross-sectional area formed by the helical spring 40 is smaller than that of the head portion 302 of the fastening bolt 30. Therefore, one end of the helical spring 40 urges against the head portion 302 and the other end against the peripheral planar surface of the fastening bolt 208 after assembly of the helical spring 40.

Figure 3:
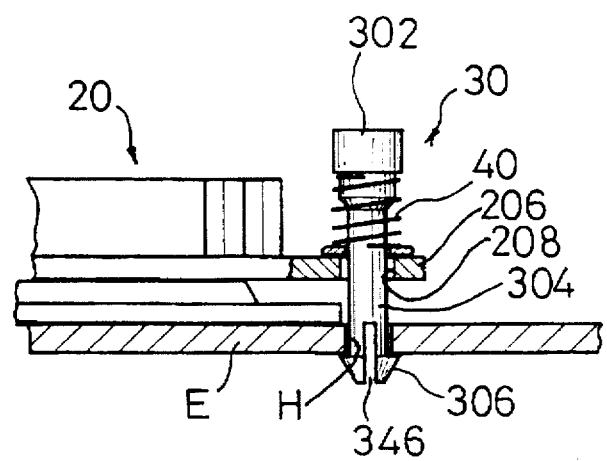
FIG. 3 is a schematic view illustrating the structure of FIG. 1 being inserted in and fastened to a motherboard.

As illustrated in FIG. 2, in operation the motherboard E is formed with penetrated holes H thereon at locations corresponding to the fastening holes 208. The holes H are so dimensioned as to be substantially the same as the fastening holes 208 for compressively clamping the insertion ends 306 of the fastening bolts 30 therein. As illustrated in FIGS. 2 and 3, in operation the chassis 202 is initially placed over a surface of the chip C, the fastening bolts 30 then in term insert through the helical springs 40 and fastening holes 208, and finally insert and clamp into the holes H formed on the motherboard E.

When the insertion end 306 of the fastening bolt 30 inserts into the hole H, the narrow opening 346 formed on the insertion end 306 of the fastening bolt 30 subjects the insertion end 306 to respond to the lateral pressure imparted to the insertion end 306 by the motherboard E thereby facilitating insertion of the fastening bolt into the hole H. Finally, collaboration between resiliency of the helical spring 40 and the shape of fastening bolt 30, the heat sink 20 can resiliently press against the chip C thereby enhancing heat transfer effect and adapting to chips of various thickness.

Figure 4:
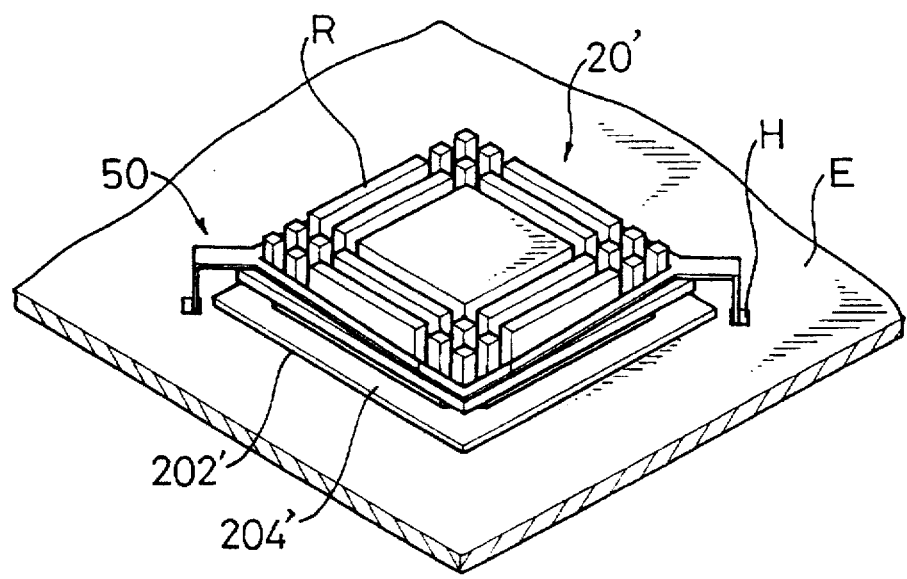
FIG. 4 illustrates a perspective view of another embodiment of the invention in use.

FIGS. 4 and 5 illustrate another embodiment according to the invention under state of being used on a motherboard E. As illustrated in the figures, a heat sink 20' is disposed over a chip C on the motherboard E. The heat sink 20' substantially comprises a chassis 202' and a fastening seat 50.

As illustrated in FIG. 5, the chassis 202' is a flat sheet having a shape and dimension substantially identical to those of the chip C, on which chassis is formed with a plurality of heat dissipating fins so as to form a heat dissipating surface R. The planar surface between the outer most edge of the chassis 202' and the heat dissipating surface R delineates a chassis edge 204'.

The fastening seat 50 is formed by a resiliently curvable and integrally formed hollow sheet, and is preferably formed of a metal sheet. It is shown in the figures that the fastening seat 50 mainly comprises an outer rim 500 and hook portions 560.

As illustrated in the figures, the shape and dimension of the outer rim 500 are substantially the same as those of the chassis edge 204'. The outer rim 500 is also telescopically provided over the chassis edge 204'. Though the outer rim 500 is an integrally formed sheet, it is further distinguished into a first section 521, a second section 522, a third section 523 and a forth section 524 which are sequentially connected, for the ease of explanation. More particularly, the shape and dimension of the first and third sections 521, 523 are completely identical to and disposed symmetrically about each other; the second and forth sections 522, 523 are also completely identical to and disposed symmetrically about each other, wherein the first and third sections 521, 523 extend horizontally and the second and forth sections 522, 524 incline upwardly and outwardly.

There are two hooks 560, each of which extends outwardly and rearwardly from center of the second and forth sections 522, 524, respectively, to form a downwardly extended L-shaped configuration.

Particularly, each hook 560 downwardly extends and connects to a V-shaped barb 562. The apex 566 of the V-shaped barb 562 extends toward the chip C, and the lower portion of each V-shaped barb 552 defines a contact surface 564. The shape of the barb 561 is preferably as shown in FIG. 6.

A pair of holes H' can be pre-formed on the motherboard E. The locations of the holes H' subject the contact surface 564 of the barbs 562 of the fastening seat 50 to contact with sides of the holes H' abutting the chip C'.

Figure 7:
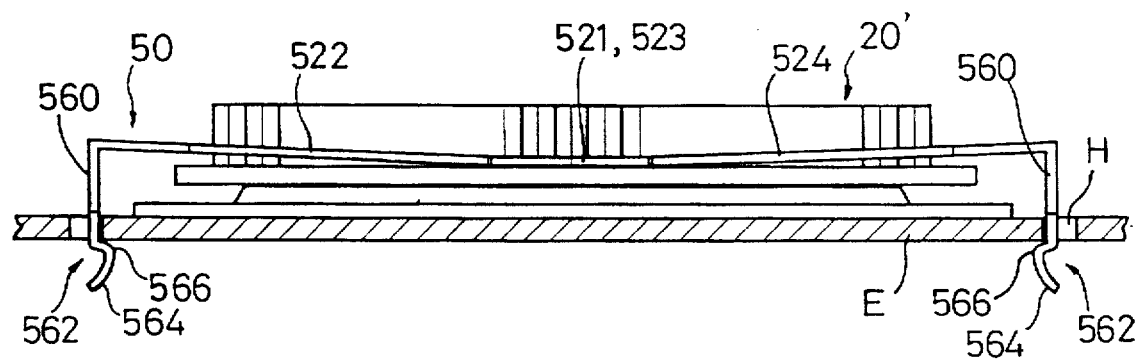
FIG. 7 a schematic view illustrating the structure of FIG. 4 being inserted in and fastened to a motherboard.

FIG. 7 is a structural illustration of FIG. 4 illustrating the state of the heat sink 20' being steadfastly fastened onto the motherboard E by means of the fastening seat 50. In view of FIGS. 4 and 7, after the barbs 562 of the fastening seat 50 are inserted into the holes H' the second and forth sections 522, 524 originally inclined upwardly and outwardly are each pressed against the chassis edge 204' of the heat sink 20' such that the heat sink 20' can be resiliently and tightly pressed against the chip C thereby enhancing heat transfer effect and adapting to chips of various thickness.

Foregoing embodiments of the invention ingeniously implement simple mechanical concepts of resilience and flexibility to a heat sink having an assembling device so as to achieve their intended functions. It should be appreciated that only trivial pressure is required to be imparted on the foregoing structure so as to subject the overall heat dissipating device being assembled to a designated location during assembly and that only trivial force is required to be imparted on the fastening bolts or fastening seat underneath the motherboard so as to release the foregoing structure during disassembly, thereby allowing the heat sinks being efficiently assembled and disassembled and steadfastly fastened without damaging the chip.

The invention can also be realized by other specific embodiments without departing from the concepts and essential features thereof. Therefore, all embodiments expounded in the foregoing descriptions are illustrative but not limited in any domain. All modifications complying with the concepts and scope of the claims or other equivalence are contemplated by the realm of the invention.

What is claimed is:

1. A heat sink having an assembly device adapting to a hole formed on a motherboard and being assembled over a chip for dissipating energy generated by said chip to the exterior, said heat sink comprising:

a chassis having a configuration and dimension substantially identical with the shape of said chip, a plurality of fins formed thereon constructing a heat dissipating surface, and a planar chassis edge defined by a planar surface between an outer most edge thereof and said heat dissipating surface, said chassis further having a plurality of fastening ends extending from said chassis edge, each of which fastening ends is formed with a fastening hole having a first diameter;

a plurality of fastening bolts in the same quantity as said fastening holes, each fastening bolt being substantially in a columnar configuration and having a head portion, a bolt body, and an insertion end from the top down, wherein said fastening bolt can penetrate through said fastening holes of said fastening ends, said bolt body is telescopically provided with a helical spring, and said insertion end is adapted to be clamped into said holes formed on said motherboard subjecting said helical spring to compression against said fastening ends;

whereby said heat sink is resiliently pressed against said chip by means of urging said fastening seat and said helical spring against said chassis as well as clamping said fastening bolts into said holes formed on said motherboard.

2. A heat sink having an assembly device according to claim 1, wherein said fastening bolts are each formed with a narrow opening penetrating from a furthermost end of said insertion end and extends into a portion of said bolt body.

3. A heat sink having an assembly device adapting to a hole formed on a motherboard and being assembled over a chip for dissipating energy generated by said chip to exterior, said heat sink comprising, a chassis having a configuration and dimension substantially identical with the shape of said chip, a plurality of fins formed thereon constructing a heat dissipating surface, and a planar chassis edge defined by a planar surface between an outer most edge thereof and said heat dissipating surface;

a fastening seat formed by a resiliently curvable and integrally formed hollow sheet, said fastening seat comprising:

an outer rim being so shaped and dimensioned as to be consistent with those of said chassis edge and to allow said outer rim to be telescopically provided over said chassis edge, said outer rim being distinguished into a first section, a second section, a third section, and a forth section which are sequentially connected, wherein the shape and dimension of said first and third sections are consistent with and disposed symmetrically about each other; and those of said second and forth sections are consistent with and disposed symmetrically about each other, said first and third sections extend horizontally, and said second and forth sections incline upwardly and outwardly;

wherein an L-shaped and downward-suspended hook extends outwardly from center of each said second and forth sections, the shape and dimension of said hooks are consistent with and disposed symmetrically about each other, and said downward-suspended ends of said hooks each comprise a V-shaped barb, an apex of said V-shaped barb converges toward said chip, a lower surface of said V-shaped barb defines a contact surface adapted to be clamped into said holes formed on said motherboard whereby said first and third sections are pressed against said chassis edge by means of resilience of said second and forth sections.

* * * * *

UNITED STATES PATENT AND TRADEMARK OFFICE
CERTIFICATE OF CORRECTION

PATENT NO.          : 5,730,210
APPLICATION NO.     : 08/804547
DATED               : March 24, 1998
INVENTOR(S)         : Chih Hsien Kou Page 1 of 1

It is certified that error appears in the above-identified patent and that said Letters Patent is hereby corrected as shown below:

In the Claims:

In column 5, line 9 (claim 1), delete "fastening seat" and insert --fastening bolt--.

Signed and Sealed this
Twenty-third Day of July, 2013

Teresa Stanek Rea
*Acting Director of the United States Patent and Trademark Office*